US006455386B1

(12) United States Patent
Mirabel

(10) Patent No.: US 6,455,386 B1
(45) Date of Patent: Sep. 24, 2002

(54) HIGH AND LOW VOLTAGE TRANSISTOR MANUFACTURING METHOD

(75) Inventor: Jean-Michel Mirabel, Cabries (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/324,290

(22) Filed: Jun. 2, 1999

(30) Foreign Application Priority Data

Jun. 3, 1998 (FR) .............................. 98 07124

(51) Int. Cl.⁷ .......................................... H01L 21/336
(52) U.S. Cl. ....................................................... 438/301
(58) Field of Search .................................. 438/275, 281, 438/301–303; 437/34, 44, 40, 41

(56) References Cited

U.S. PATENT DOCUMENTS

| 5,283,449 | A | | 2/1994 | Ooka ........................... 257/204 |
| 5,472,887 | A | | 12/1995 | Hutter et al. ................. 437/324 |
| 5,493,142 | A | | 2/1996 | Randazzo et al. ........... 257/328 |
| 5,498,554 | A | * | 3/1996 | Mei ............................... 437/34 |
| 5,589,423 | A | | 12/1996 | White et al. ................. 437/228 |
| 5,620,920 | A | | 4/1997 | Wilmsmeyer ................ 438/227 |
| 5,721,170 | A | * | 2/1998 | Bergemont ................... 438/303 |
| 5,946,573 | A | * | 8/1999 | Hsu ............................. 438/275 |
| 5,963,803 | A | * | 10/1999 | Dawson et al. .............. 438/231 |

* cited by examiner

Primary Examiner—Caridad Everhart
Assistant Examiner—Calvin Lee
(74) Attorney, Agent, or Firm—Wolf, Greenfield & Sacks, P.C.; James H. Morris; Mark Steinberg

(57) ABSTRACT

The present invention relates to a method of manufacturing integrated circuits including high and low voltage MOS transistors. This method includes steps of forming insulated gate structure forming lightly-doped drain/source regions, depositing an insulating layer; forming a mask above the gates of the high voltage transistors which extends laterally beyond said gates; etching the insulating layer to leave spacers on the edges of the low voltage transistor gates; implanting a dopant adapted to forming heavily-doped drain/source contact regions of the high and low voltage transistors; and forming in a self-aligned way a metal silicide layer on the drain/source contact regions of all transistors, as well as on the gate contacts of the low voltage transistors.

29 Claims, 4 Drawing Sheets

HIGH AND LOW VOLTAGE TRANSISTOR MANUFACTURING METHOD

BACKGROUND OF THE INVENTION

1. Field of the Invention

The present invention generally relates to the field of semiconductor component manufacturing. More specifically, the present invention relates the manufacturing, in a semiconductor substrate of high and low voltage CMOS transistors, usable for example in memory devices.

2. Discussion of the Related Art

FIGS. 1 to 9 schematically illustrate, in cross-sectional view, successive steps of a method of manufacturing different high and low voltage MOS transistors on the same substrate according to a conventional method.

As illustrated in FIG. 1, a lightly-doped substrate 1 of a first conductivity type, for example P, on which lightly-doped wells 3 of opposite conductivity type N have been formed, is considered. It should be noted that "substrate" here is used to designate an upper layer or region of a semiconductor component, for example, an integrated circuit. Several insulated structures 2 formed of an insulating layer, for example, silicon oxide, and of a semiconductive layer, for example, polysilicon, meant to form the gates of each of the transistors, have also been formed on this substrate. A thicker gate oxide for high voltage transistors than for low voltage transistors may be provided.

It is desired to form, in substrate 1, in the left-hand portion of the drawings, a high voltage N-channel transistor HTN and a low voltage N-channel transistor LTN. It is desired to form in well 3, in the right-hand portion of the drawings, a high-voltage P-channel transistor HTP and a low voltage P-channel transistor LTP. In the following description, HTN, LTN, HTP or LTP will designate a completed transistor as well as a portion of the substrate or the well in which the corresponding transistor is being formed.

It is desired to form LDD-type transistors, among which, for high voltage transistors HTP and HTN, the heavily-doped drain/source contact region is more distant from the channel region than for low voltage transistors LTP and LTN.

At the next step, illustrated in FIG. 2, a first masking layer 4 is formed, to expose portions of the substrate in which transistors HTN and LTN are to be created. A low dose implantation of an N-type dopant adapted to forming lightly-doped drain and source regions 5 is performed. This implantation will be called hereafter $LDD_N$ implantation.

At the next step, illustrated in FIG. 3, a second masking layer 6 is formed, to expose N-type wells 3 in which transistors HTP and LTP are to be created. A low dose implantation of a P-type dopant adapted to forming lightly-doped drain and source regions 7 is performed. This implantation will be called hereafter. $LDD_P$ implantation.

At the next step, illustrated in FIG. 4, an insulating layer 8, typically silicon oxide, is deposited over the entire structure (full plate).

At the next step, illustrated in FIG. 5, oxide layer 8 is etched without masking to only leave lateral spacers 9 on the edges of insulated gate structures 2 of the transistors.

At the next step, illustrated in FIG. 6, a third masking layer 10 is deposited. Third mask 10 is etched to completely cover P-channel transistor areas HTP and LTP, to completely expose low voltage transistor areas LTN, and to cover the gates of high voltage transistors HTN by laterally extending beyond these. A high dose N-type doping is then performed to make heavily-doped N-type drain/source contact regions 11 of transistors HTN and LTN. The pattern of mask 10 is such that regions 11 are more distant from the gates of high voltage transistors HTN than from the gates of low voltage transistors LTN. Indeed, for the latter, the distance between the projection of the gate and the contact regions is determined by spacers 9. Further, the drain/source contact regions of two adjacent transistors are distinct from each other.

At the next step, illustrated in FIG. 7, drain/source contact regions 13 of transistors HTP and LTP are made similarly. For this purpose, a fourth masking layer 12 is deposited. Fourth mask 12 is etched to completely cover N-channel transistor areas HTN and LTN, to completely expose low voltage transistor areas LTP, and to cover the gates of high voltage transistors HTP by laterally extending beyond these. A high dose P-type doping is then performed to make heavily-doped P-type drain/source contact regions 13 of transistors HTP and LTP. The pattern of mask 12 is such that regions 13 are more distant from the gates of high voltage transistors HTP than from the gates of low voltage transistors LTP. Indeed, for the latter, the distance between the projection of the gate and the contact regions is determined by spacers 9. Further, the drain/source contact regions of two adjacent transistors are distinct from each other.

At the next step, illustrated in FIG. 8, an insulator layer 14, typically a multiple layer structure, for example, of titanium, titanium nitride, and silicon oxide is deposited over the full plate.

At the next step, illustrated in FIG. 9, layer 14 is opened above the drain/source contact regions of all transistors. Then, a metal silicide layer 15, typically titanium silicide, is formed by high temperature fast thermal anneal on all apparent silicon surfaces. It should be noted that this silicidation is also performed on the gates of low voltage transistors LTN and LTP.

A disadvantage of this method is the etching of oxide layer 8 meant to form spacers 9 of the different transistors, which etching is performed after the $LDD_N$ and $LDD_P$ implantations. Indeed, this etching also etches the surface of substrate 1, which deteriorates lightly-doped shallow underlying regions 5 and 7. This is particularly disturbing on either side of the gates of the high voltage transistors where lightly-doped shallow region 5/7 has to remain in place. It should be noted that this disadvantage is even more serious in the case of submicronic technologies in which the lightly-doped regions are particularly shallow.

Another disadvantage of this method is that the mask of definition of the silicided areas is not, at the level of the high voltage transistors, self-aligned with source/drain contact regions 11/13.

SUMMARY OF THE INVENTION

An object of the present invention is to provide a method of manufacturing high and low voltage MOS transistors on a same semiconductor substrate which overcomes these disadvantages.

Another object of the present invention is to provide a method of manufacturing high and low voltage MOS transistors on the same semiconductor substrate which is of more easy implementation, lower cost, and which reduces the number of manufacturing steps.

To achieve these and other objects, the present invention provides a method of manufacturing integrated circuits including high and low voltage MOS transistors of same type, this method including the steps of forming insulated gate structures, forming lightly-doped drain/source regions, depositing an insulating layer, and further including the steps of:

1) forming a mask above the gates of the high voltage transistors which extends laterally beyond said gates;

2) etching the insulating layer to leave spacers on the edges of the low voltage transistor gates;

3) implanting a dopant adapted to forming heavily-doped drain/source contact regions of the high and low voltage transistors; and 4) forming in a self-aligned way a metal silicide layer on the drain/source contact regions of all transistors, as well as on the gate contacts of the low voltage transistors.

According to an embodiment of the present invention, the sequence of steps 1) to 3) is implemented twice, once for each series of MOS transistors of a given conductivity type.

According to an embodiment of the present invention, at steps 2) and 3), oxide areas are left in place in selected regions.

According to an embodiment of the present invention, the method applies to technological lines in which the minimum dimension of a pattern is under 1 $\mu$m.

The foregoing objects, features and advantages of the present invention will be discussed in detail in the following non-limiting description of a specific embodiment in connection with the accompanying drawings.

DETAILED DESCRIPTION

For clarity, and as is usual in the representation of integrated circuits, the different drawings are not to scale. Further, the same elements are designated by the same references.

The initial steps of the method according to the present invention are identical to those described in relation with FIGS. 1 to 4.

Figure 1:
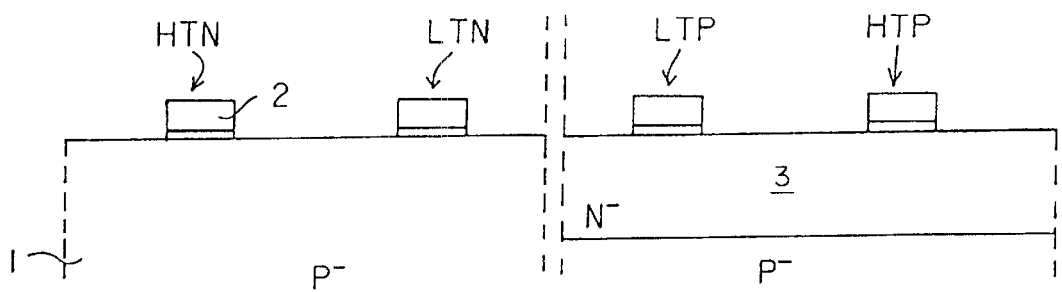
FIGS. 1 to 9 illustrate successive steps of a conventional method of manufacturing high and low voltage CMOS transistors.
Figure 2:
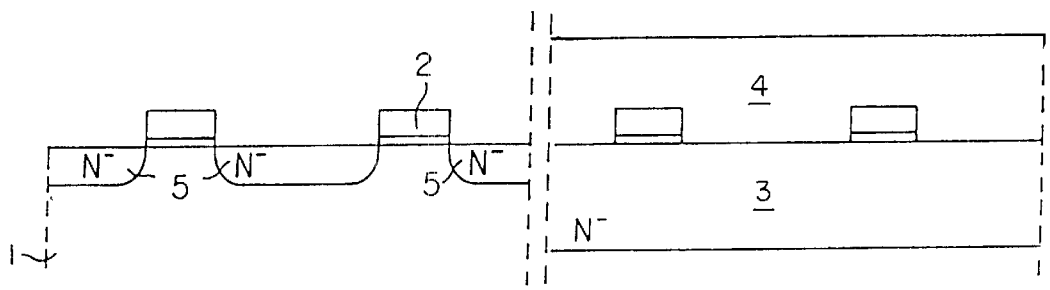
Figure 3:
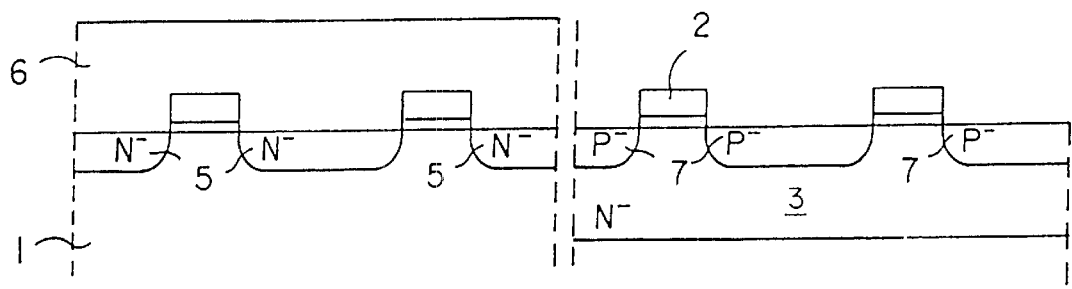
Figure 4:
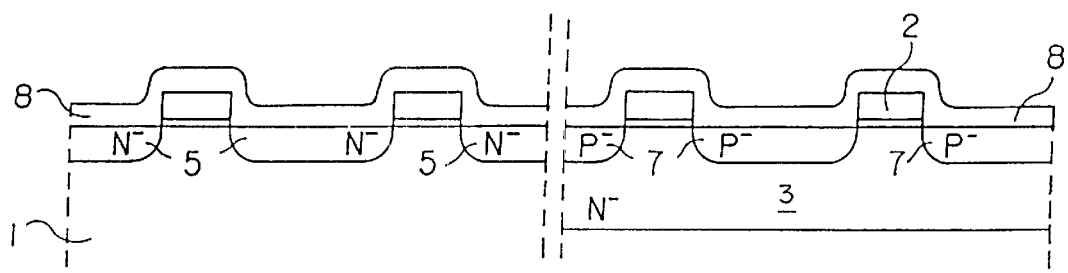
Figure 5:
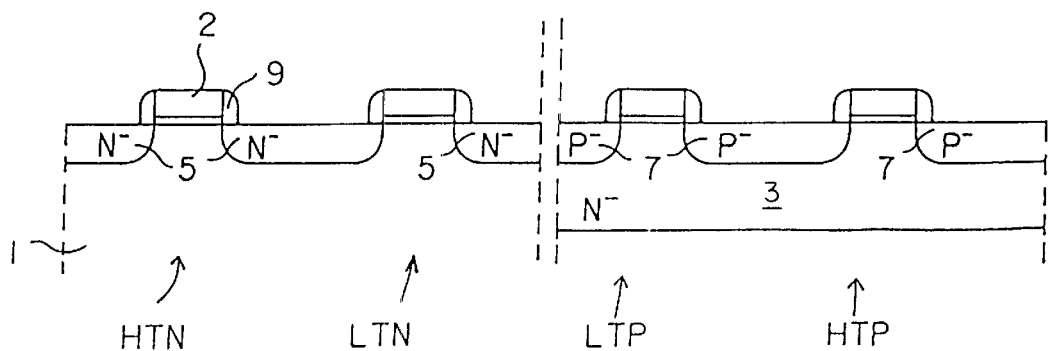
Figure 6:
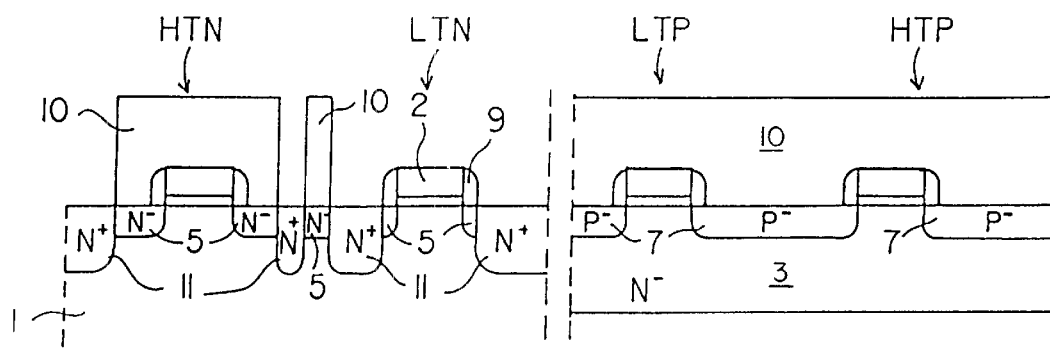
Figure 10:
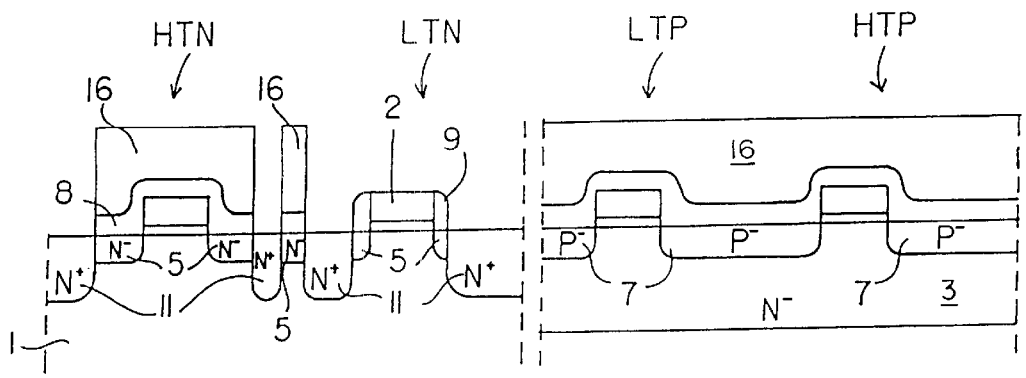
FIGS. 10 to 12 illustrate successive steps of a method according to the present invention of manufacturing high and low volt e CMOS transistors.

Then, as shown in FIG. 10, instead of directly etching oxide layer 8 to form spacers as well around the gates of the low voltage transistors as around the gates of the high voltage transistors, a masking step is first performed. A first mask 16, identical to mask 10 of FIG. 6, is first formed. Oxide layer 8 is then etched through the openings of this mask. After this, a high dose N-type doping is performed to form drain/source contact regions of the high and low voltage N-channel transistors.

Figure 7:
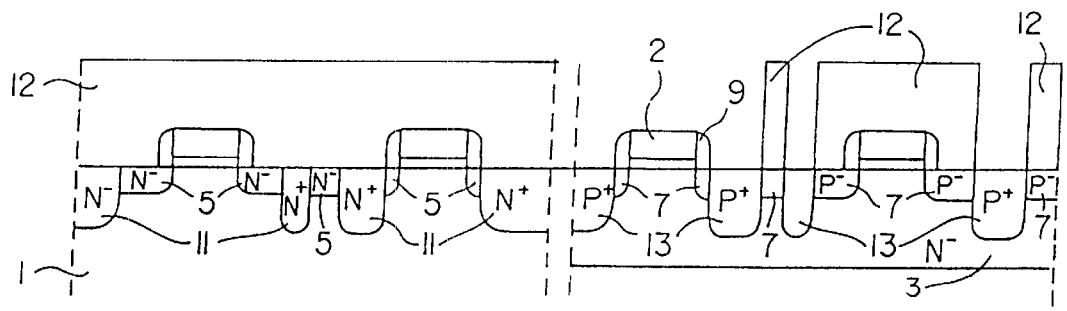
Figure 11:
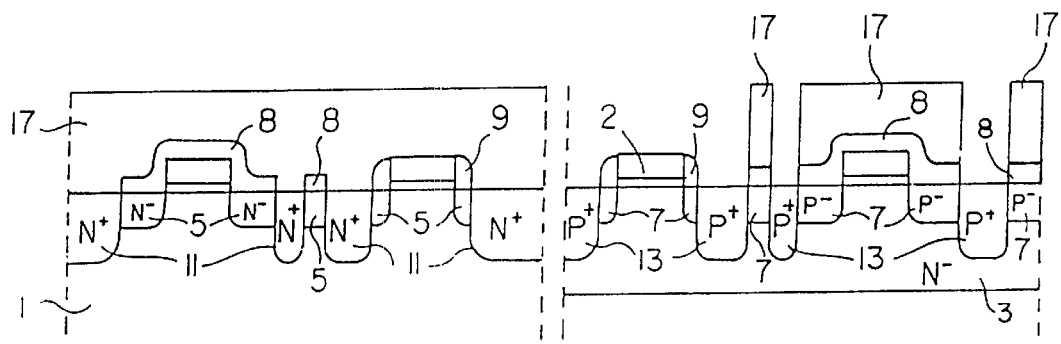

Then, as shown in FIG. 11, a second mask 17, identical to mask 12 of FIG. 7, is formed. Oxide layer 8 is then etched through the openings of this mask. After this, a high dose P-type doping is performed to form drain/source contact regions of the high and low voltage P-channel transistors.

Figure 12:
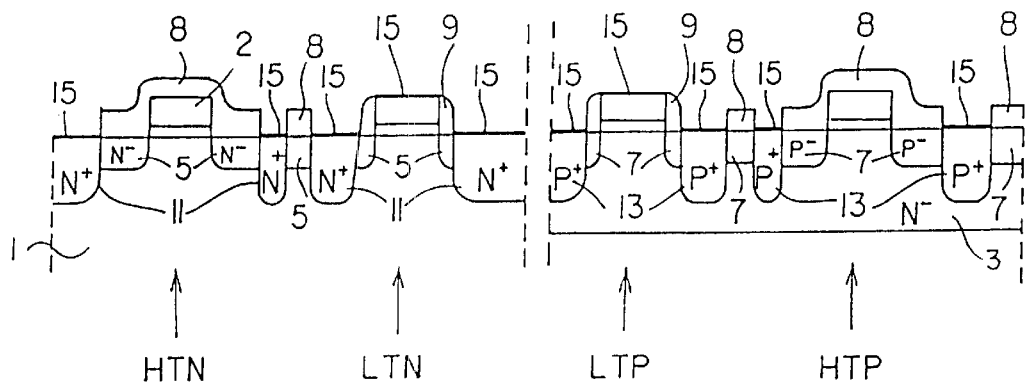

Then, as shown in FIG. 12, after removing last mask 17, the contacts are silicided.

A first advantage of the present invention is that an oxide layer is no longer etched above lightly-doped portions of the drain and source regions which will be maintained, but only above the portions of these regions in which implantations meant to heavily dope said portions are performed.

Figure 8:
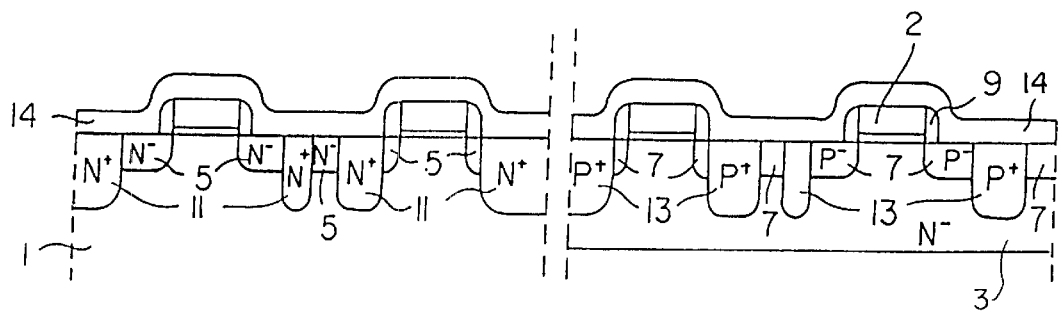
Figure 9:
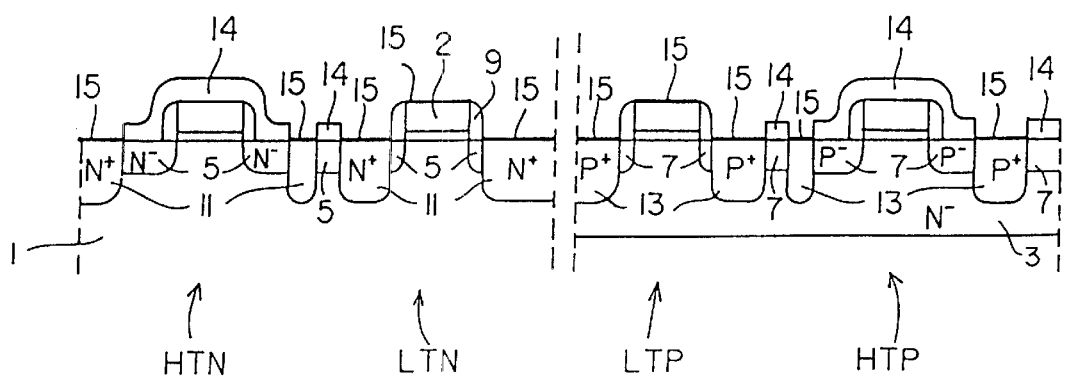

Another advantage of the present invention is that it includes fewer steps than the conventional method. Indeed, it only includes one step of oxide layer deposition and etching. Oxide layer 14 of FIG. 8 no longer exists in the method of the present invention.

Another advantage of the present invention is that the first and second masks according to the present invention (16 and 17 in FIGS. 10 and 11) have the same pattern as the third and fourth masks (10 and 12 in FIGS. 6 and 7) of the conventional method.

Another advantage of the present invention is that the silicidation illustrated in FIG. 12 is self aligned with the regions on which the heavily-doped drain/source contact areas have been formed.

Of course, the present invention is likely to have various alterations, modifications, and improvements which will readily occur to those skilled in the art. In particular, although the present invention has been described in the case of the simultaneous manufacturing of N-channel and P-channel transistors, it also applies, more simply still, to the formation, on the same substrate, of high and low voltage MOS transistors of a single conductivity type.

Further, insulating oxide layer 8 may be replaced with a multiple layer structure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing integrated circuits including high and low voltage MOS transistors of same type, including the steps of:

a) forming insulated gate structures;

b) forming lightly-doped drain/source regions;

c) depositing an insulating layer;

d) forming a mask above the gates of the high voltage transistors after depositing the insulating layer, the mask extending laterally beyond said gates;

e) etching the insulating layer, through openings in the mask, to leave spacers, formed from the insulating layer, on the edges of the low voltage transistor gates;

f) implanting a dopant adapted to forming heavily-doped drain/source contact regions of the high and low voltage transistors; and g) forming, in a self-aligned way, a metal silicide layer on the drain/source contact regions of all transistors, as well as on the gate contacts of the low voltage transistors.

2. The method of claim 1 of formation of high and low voltage transistors of complementary types, wherein the sequence of steps d) to f) is implemented twice, once for each series of MOS transistors of a given conductivity type.

3. The method of claim 1, wherein at steps e) and f), oxide areas are left in place in selected regions.

4. The method of claim 1, applying to technological lines in which the minimum dimension of a pattern is under 1 $\mu$m.

5. The method of claim 1 wherein forming an insulating layer includes forming an insulating layer having a portion covering the high voltage transistor gates, the etching the insulating layer further comprises etching to leave the portion of the insulating layer covering the high voltage transistor gates, the implanting a dopant comprises implanting a dopant through openings in the insulating layer, and the forming in a self-aligned way comprises forming in a self-aligned way, through the openings in the insulating layer.

6. The method of claim 1, wherein between the forming lightly-doped drain/source regions and the implanting a dopant, the lightly doped drain/source regions are exposed by etching only once.

7. The method of claim 1, wherein the implanting a dopant comprises implanting into all portions of lightly-doped drain/source regions exposed during etching.

8. A method of manufacturing integrated circuits including high and low voltage MOS transistors of same type, including the steps of:
  a) forming insulated gate structures;
  b) forming lightly-doped drain/source regions;
  c) depositing an insulating layer;
  d) forming a mask above the gates of the high voltage transistors, the mask extending laterally beyond said gates;
  e) etching the insulating layer, through openings in the mask, to leave spacers, formed from the insulating layer, on the edges of the low voltage transistor gates;
  f) implanting a dopant adapted to forming heavily-doped drain/source contact regions of the high and low voltage transistors; and
  g) forming, in a self-aligned way, a metal silicide layer on the drain/source contact regions of all transistors, as well as on the gate contacts of the low voltage transistors.

9. The method of claim 8, wherein the sequence of steps d) to f) is implemented twice, once for each series of MOS transistors of a given conductivity type.

10. The method of claim 8, wherein at steps e) and f), oxide areas are left in place in selected regions.

11. The method of claim 8, applying to technological lines in which the minimum dimension of a pattern is under 1 $\mu$m.

12. The method of claim 8 wherein forming an insulating layer includes forming an insulating layer having a portion covering the high voltage transistor gates, the etching the insulating layer further comprises etching to leave the portion of the insulating layer covering the high voltage transistor gates, the implanting a dopant comprises implanting a dopant through openings in the insulating layer, and the forming in a self-aligned way comprising forming in a self-aligned way, through the openings in the insulating layer.

13. The method of claim 8, wherein the implanting a dopant comprises implanting into all portions of lightly-doped drain/source regions exposed during etching.

14. The method of claim 8, wherein between the forming lightly-doped drain/source regions and the implanting a dopant, the lightly doped drain/source regions are exposed by etching only once.

15. A method of manufacturing integrated circuits including high and low voltage MOS transistors of same type, including:
  a) forming insulated gate structures;
  b) forming lightly-doped drain/source regions of the high and low voltage transistors;
  c) depositing an insulating layer after forming the lightly-doped drain/source regions, the insulating layer having a portion covering the high voltage transistor gates;
  d) forming a mask above the insulating layer, the mask having a portion above and extending laterally beyond the gates of the high voltage transistors and having openings above the gates of the low voltage transistors;
  e) etching the insulating layer through the openings in the mask to leave spacers, formed from the insulating layer, on the edge of the low voltage transistor gates, and to leave the portion of the insulating layer covering the high voltage transistor gates;
  f) implanting a dopant, through openings in the insulating layer, to form heavily-doped drain/source contact region of the high and low voltage transistors; and
  g) forming, in a self-aligned way, a metal silicide layer on the drain/source contact regions of the high and low voltage transistors, as well as on the gate contacts of the low voltage transistors.

16. The method of claim. 15, wherein the etching in e) further comprises exposing portions of lightly-doped drain/source regions, and the implant in f) further comprises implanting into all portions of lightly-doped drain/source regions exposed by such etching.

17. The method of claim 15, wherein between the forming lightly-doped drain/source regions and the implanting a dopant, the lightly doped drain/source regions are exposed by etching only once.

18. The method of claim 15, wherein the mask in d) has portions above regions that are between the drain/source contact regions of the high voltage transistors and the drain/source regions of the low voltage transistors, and the etching in e) further comprises leaving the portion of the insulating layer that are above the regions between the drain/source contact regions of the high voltage transistors and the drain/source regions of the low voltage transistors.

19. The method of clam 15, wherein the mask in d) has openings above regions of the high and low voltage transistors where heavily-doped drain/source contact regions are to be formed, the etching in e) is performed through such mask openings to provide openings in the insulating layer to expose surfaces where the heavily-doped drain/source contact regions are to be formed, and the metal silicide layer in g) is formed on the exposed surfaces.

20. The method of claim 15, wherein the sequence of d) to f) is implemented twice, once for each series of MOS transistors of a given conductivity type.

21. The method of claim 15, wherein at e) and f), oxide areas are left in place in selected regions.

22. The method of claim 15, applying to technological lines in which the minimum dimension of a pattern is under 1 $\mu$m.

23. The method of claim 15, wherein the mask in d) has openings above regions of the high and low voltage transistors where heavily-doped drain/source contact regions are to be formed, and the implanting in f) is performed through the openings in the mask.

24. The method of claim 23, wherein the mask in d) has portions above regions that are between the drain/source contact regions of the high voltage transistors and the drain/source regions of the low voltage transistors, and the etching in e) further comprises leaving the portion of the insulating layer that are above the regions between the drain/source contact regions of the high voltage transistors and the drain/source regions of the low voltage transistors.

25. The method of claim 24, wherein the mask in d) has openings above regions of the high and low voltage transistor where heavily-doped drain/source contact regions are to be formed, the etching in e) is performed through such mask openings to provide openings in the insulating layer to expose surfaces where the heavily-doped drain/source contact regions are to be formed, and the metal silicic layer in g) is formed on the exposed surfaces.

26. The method of claim 25, wherein the sequence of d) to f) is implemented twice, once for each series of MOS transistors of a given conductivity type.

27. The method of claim 25, wherein at e) and f), oxide areas are left in place in selected regions.

28. The method of claim 25, applying to technological lines in which the minimum dimension of a pattern is under 1 µm.

29. A method of manufacturing integrated circuits including high and low voltage MOS transistors of same type, including the steps of;

a) forming insulated gate structure;

b) forming lightly-doped drain/source regions;

c) depositing an insulating layer having a portion covering the high voltage transistor gates;

d) forming a mask above the gates of the high voltage transistors after depositing the insulating layer, the mask extending laterally beyond said gates;

e) etching the insulating layer to leave spacers on the edges of the low voltage transistor gates and to leave the portion of the insulating layer covering the high voltage transistor gates;

f) implanting a dopant, through openings in the insulating layer, adapted to forming heavily-doped drain/source contact regions of the high and low voltage transistors; and g) forming in a self-aligned way, through openings in the insulating layer, a metal silicide layer on the drain/source contact regions of all transistors, as well as on the gate contacts of the low voltage transistors.

\* \* \* \* \*